(12) United States Patent
Londhe et al.

(10) Patent No.: US 10,775,432 B2
(45) Date of Patent: Sep. 15, 2020

(54) PROGRAMMABLE SCAN COMPRESSION

(71) Applicant: Seagate Technology LLC, Cupertino, CA (US)

(72) Inventors: Bharat P. Londhe, Pune (IN); Jay Shah, Pune (IN); Aniruddha M. Bhasale, Pune (IN)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 0 days.

(21) Appl. No.: 15/992,683

(22) Filed: May 30, 2018

(65) Prior Publication Data

US 2019/0369162 A1 Dec. 5, 2019

(51) Int. Cl.
| | | |
|---|---|---|
| G01R 31/317 | (2006.01) | |
| G01R 31/3177 | (2006.01) | |
| G01R 31/3185 | (2006.01) | |
| G01R 31/3181 | (2006.01) | |
| G01R 31/3183 | (2006.01) | |

(52) U.S. Cl.
CPC ..... *G01R 31/3172* (2013.01); *G01R 31/3177* (2013.01); *G01R 31/31724* (2013.01); *G01R 31/31813* (2013.01); *G01R 31/318335* (2013.01); *G01R 31/318533* (2013.01); *G01R 31/318547* (2013.01)

(58) Field of Classification Search
CPC ............ G01R 31/3172; G01R 31/3177; G01R 31/31724; G01R 31/31813; G01R 31/318335; G01R 31/318533; G01R 31/318547

USPC ................................. 714/727, 726, 729, 724
See application file for complete search history.

(56) References Cited

U.S. PATENT DOCUMENTS

| | | | | |
|---|---|---|---|---|
| 5,983,380 | A * | 11/1999 | Motika ........... | G01R 31/318385 714/733 |
| 6,813,739 | B1 | 11/2004 | Grannis, III | |
| 7,058,869 | B2 * | 6/2006 | Abdel-Hafez .............................. | G01R 31/318572 714/726 |
| 7,111,216 | B2 | 9/2006 | Nalbantis | |
| 7,552,373 | B2 * | 6/2009 | Wang ................ | G01R 31/31926 714/724 |
| 7,779,322 | B1 * | 8/2010 | Wang .............. | G01R 31/318547 714/729 |
| 7,925,947 | B1 * | 4/2011 | Touba ............. | G01R 31/318547 714/726 |
| 7,945,833 | B1 * | 5/2011 | Wang .............. | G01R 31/318547 714/729 |
| 9,606,179 | B1 * | 3/2017 | Cunningham . | G01R 31/318544 |
| 10,215,803 | B1 * | 2/2019 | Remersaro ......... | G01R 31/3177 |
| 2004/0148553 | A1 | 7/2004 | Nalbantis | |
| 2004/0230884 | A1 * | 11/2004 | Rajski ............. | G01R 31/318566 714/742 |
| 2005/0055617 | A1 * | 3/2005 | Wang ............. | G01R 31/318335 714/727 |

(Continued)

*Primary Examiner* — John J Tabone, Jr.
(74) *Attorney, Agent, or Firm* — Holzer Patel Drennan

(57) ABSTRACT

An implementation of a system disclosed herein includes a decompressor logic with the capability to vary a level of decompression of a scanning input signal based on value of compression program bits and a compressor logic to generate a scanning output signal, the compressor logic including a plurality of XOR logics, wherein the output of the plurality of XOR logics is selected based on the compression program bits.

17 Claims, 4 Drawing Sheets

(56) References Cited

U.S. PATENT DOCUMENTS

| | | | |
|---|---|---|---|
| 2005/0188290 A1* | 8/2005 | Motika | G01R 31/311 714/733 |
| 2005/0268190 A1* | 12/2005 | Kapur | G01R 31/318536 714/726 |
| 2005/0268194 A1* | 12/2005 | Wang | G01R 31/318547 714/733 |
| 2006/0059387 A1 | 3/2006 | Swoboda et al. | |
| 2006/0064614 A1* | 3/2006 | Abdel-Hafez | G01R 31/318547 714/726 |
| 2007/0260952 A1* | 11/2007 | Devanathan | G01R 31/318575 714/726 |
| 2008/0052578 A1* | 2/2008 | Rajski | G01R 31/318335 714/729 |
| 2008/0052586 A1* | 2/2008 | Rajski | G01R 31/318335 714/741 |
| 2008/0195346 A1* | 8/2008 | Lin | G01R 31/318575 702/119 |
| 2008/0256274 A1* | 10/2008 | Wohl | G01R 31/318547 710/68 |
| 2008/0256497 A1* | 10/2008 | Wohl | G06F 17/505 716/103 |
| 2009/0240996 A1* | 9/2009 | Sasaya | G01R 31/318536 714/729 |
| 2010/0083199 A1* | 4/2010 | Wohl | G01R 31/318547 716/136 |
| 2010/0332928 A1 | 12/2010 | Li et al. | |
| 2011/0047426 A1* | 2/2011 | Touba | G01R 31/318547 714/729 |
| 2011/0307750 A1* | 12/2011 | Narayanan | G01R 31/318547 714/729 |
| 2013/0159800 A1* | 6/2013 | Ravi | G01R 31/3177 714/727 |
| 2014/0143623 A1* | 5/2014 | Touba | G01R 31/318547 714/728 |
| 2015/0153410 A1* | 6/2015 | Lin | G01R 31/318536 714/727 |
| 2016/0003907 A1* | 1/2016 | Rasjki | G01R 31/318547 714/738 |
| 2017/0205463 A1* | 7/2017 | Nakamura | G01R 31/31707 |
| 2019/0011500 A1* | 1/2019 | Shah | G01R 31/3177 |
| 2019/0033374 A1* | 1/2019 | Bhagwat | G01R 31/318544 |

* cited by examiner

PROGRAMMABLE SCAN COMPRESSION

BACKGROUND

With increasing complexity of integrated circuit devices, such as signal processing circuits, data processing circuits, and other integrated circuits, the digital circuitry needed to control and assist that functionality is also becoming more complex. As a result, tests which can quickly identify faulty devices before applying lengthy analog functional tests can help simplify and speed production testing. A scan path approach offers an inexpensive way of testing digital functionality.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

An implementation of a system disclosed herein includes a decompressor logic with the capability to vary a level of decompression of a scanning input signal based on value of compression program bits and a compressor logic to generate a scanning output signal, the compressor logic including a plurality of XOR logics, wherein the output of the plurality of XOR logics is selected based on the compression program bits.

These and various other features and advantages will be apparent from a reading of the following detailed description.

BRIEF DESCRIPTIONS OF THE DRAWINGS

A further understanding of the nature and advantages of the present technology may be realized by reference to the figures, which are described in the remaining portion of the specification.

FIG. illustrates an alternative example block diagram of scan compression logic as disclosed herein.

Figure 4:
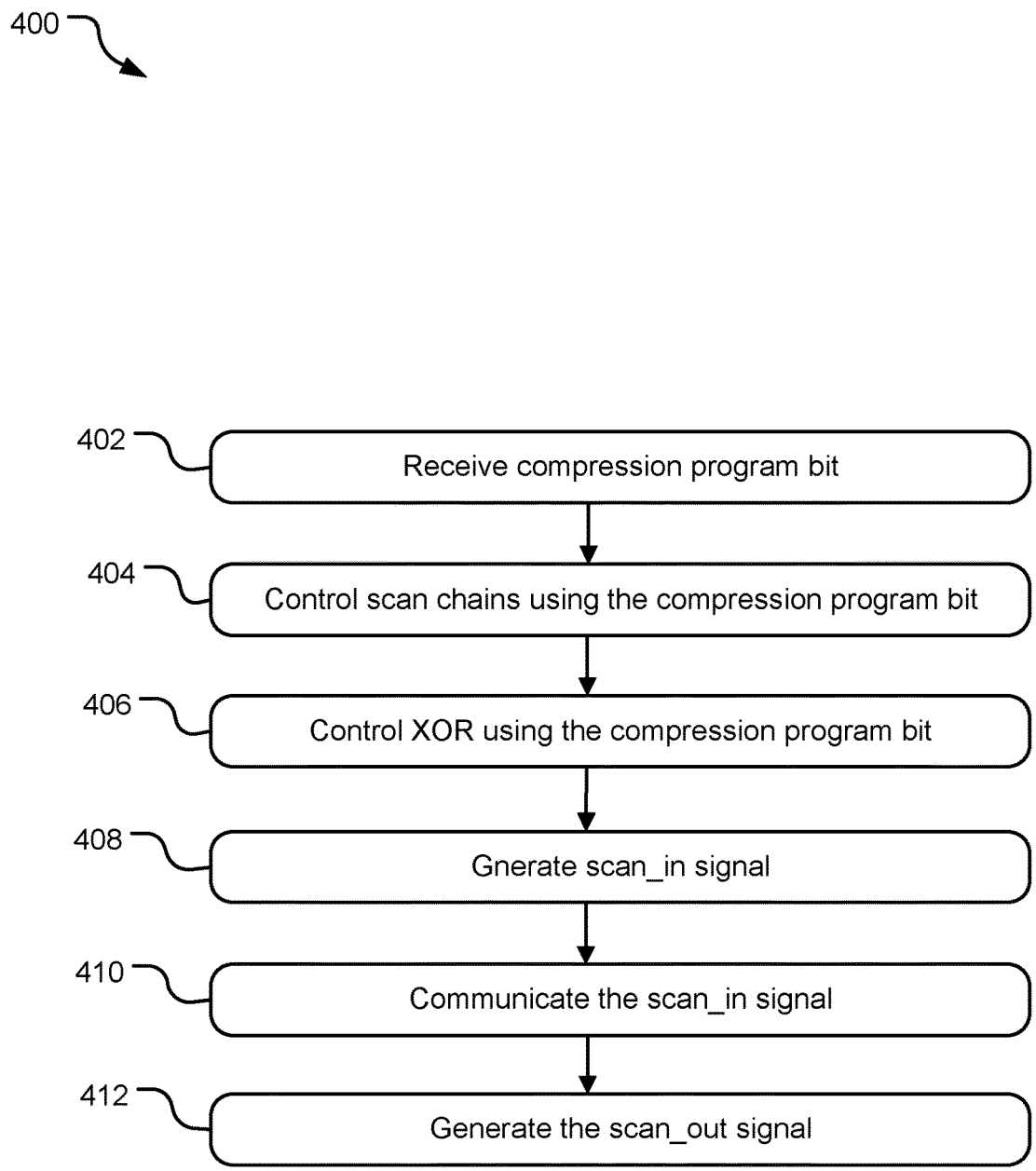

FIG. 4 illustrates an example flowchart including operations for the programmable scan compression as disclosed herein.

DETAILED DESCRIPTIONS

Implementations of the technology described herein are disclosed herein in the context of a programmable scan compression system. Reference will now be made in detail to implementations of the technology described herein as illustrated in the accompanying drawings and the following detailed description to refer to the same or like parts.

Technological products such as computing devices, mobile devices, telecommunication devices, etc., use a large number of integrated circuits (ICs, also referred to as "chips"). Testing systems are used to test functioning of ICs at the factory level to ensure that when the ICs are provided to the manufacturer or integrator of devices, the ICs function in an expected manner. To this end, ICs are provided with test-structures that can be tested with scanning signals. Specifically, such test-structures within the ICs are expected to generate specific output signals in response to known input signals. Such input signals are referred to as the scan_in signals and the output from the ICs is referred to as the scan_out signal.

According to an implementation of scan compression system a scan_in signal is decompressed and broadcast to internal scan chains using decompressor logic. Subsequently, internal scan chains are compressed through XOR tree and observed on scan_out using a compressor logic. In this method scan compression level is fixed and there is no way to change it while generating scan pattern set. In such an implementation, scan compression ratio is decided such that there is no scan test coverage impact. Here scan test patterns are generated for single scan compression configuration mode to achieve desirable scan test coverage.

A programmable scan controller for scanning a chip for design failures is disclosed herein. Specifically, the programmable scan controller disclosed herein includes a decompressor logic for decompressing a scanning signal to be sent to a plurality of scan chains internal to the chip. In one implementation disclosed herein, the decompression level may be selected by a compression program bit. The programmable scan controller disclosed herein also includes a compression logic.

The implementations disclosed herein allows scanning to be done with variable compression levels such that with high compression the test time is reduced whereas with low compression the scan coverage is increased.

Figure 1:
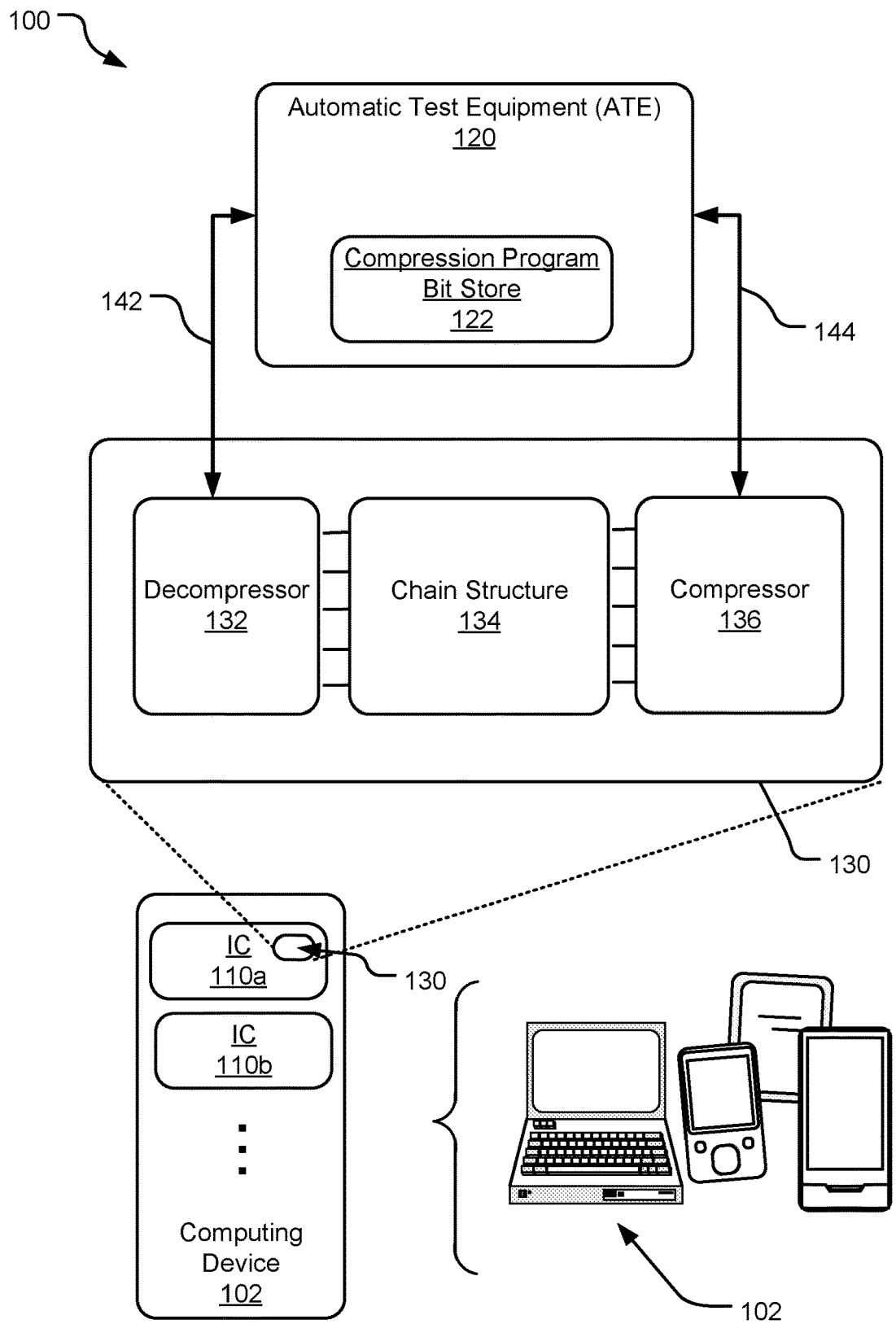
FIG. 1 illustrates example block diagram of a system using the programmable scan compression technique disclosed herein.

FIG. 1 illustrates a block diagram 100 of a system using the programmable scan compression technique disclosed herein. Specifically, the system 100 illustrates a computing device 102 which may be any computing device, such as a computer, a mobile device, etc., that uses one or more integrated circuits (ICs) 110a, 110b (referred to hereinafter as IC 110). For example, the IC 110 may be an IC on a storage device of the computing device 102. The IC 110 may include a programmable scan controller 130 that is used to ascertain that the IC 110 is manufactured or productized correctly.

In the illustrated implementation, an automated test equipment (ATE) 120 may be used to test the programmable scan controller 130. For example, after a mass production of a batch of given type of IC, the ATE 120 tests a selected sample number of the ICs from that batch and if the tests are successful, the batch of IC may be shipped for the next stage.

For example, the ATE 120 may send a test pattern as a scan_in signal 142 to the programmable scan controller 130. The programmable scan controller 130 processes the scan_in signal 142 and generates a scan_out signal 144 that is returned back to the ATE 120. The ATE 120 evaluates the scan_out signal 144 to ensure that it is as expected. In some implementations, the process of evaluating the programmable scan controller 130 may take time in the order of milli-seconds (ms). As a large number of ICs may have to be tested, the testing time adds to the total cost of ICs.

In the implementations disclosed herein, the programmable scan controller 130 includes one of more components that allows reducing the time to perform the testing. Specifically, the programmable scan controller 130 includes a decompressor 132 that decompresses the scan_in signal 142 before it is communicated through a chain structure 134. The output from the chain structure 134 is fed to a compressor 136 that compresses the output from the chain structure 134 to generate the scan_out signal 144. Using the programmable scan controller 130 including the decompressor 132 and the compressor 136 also reduces the amount of data that has to be sent to the programmable scan controller 130 for the testing purpose, which results in less amount of data that has to be processed by the ATE 120.

While using the compressor 132 and the decompressor 136 helps reducing the test time, it may degrade the test coverage. Using the programmable scan controller 130 disclosed herein allows reducing the test time without compromising the level of certification for the programmable scan controller 130. Specifically, the programmable scan controller 130 allows a user to achieve high scan compression so as to reduce the scan time without degrading the scan test coverage of the programmable scan controller 130.

The chain structure 134 may include a plurality of chains of flipflops (also referred to as "scan chains"). Each of the scan chains is fed with a series of patterns. For example, the series of patterns may be a series of random patterns. Specifically, in the disclosed implementations, output from one or more of the scan chains is input to other scan chains using multiplexers (such as the multiplexers 230, 232 shown in FIG. 2). The multiplexers are controlled by compression program bit that is controlled by the ATE 120.

The output from the series of scan chains is input to the compressor 136. The compressor 136 may have a large number of comparators implemented using XOR logic. Specifically, if it is desired that scan compression ratio is 0.5 Cx, that is, scan compression time is approximately reduced by 50%, an XOR logic (such as the XOR logic 240, 242 disclosed in FIG. 2) is provided for every scan chains per scan partition. As a result, for every scan chain partition, the data output from the XOR logic is one bit. In the illustrated implementation, the scan compression ratio is selected by the compression program bit store 122 from ATE 120. Furthermore, the output from the XOR logics is input to an AND gate (such as the AND gate 250 disclosed in FIG. 2). The compression program bit is also input to the AND gate.

If the programmable scan controller 130 is configured to provide three different compression levels, it may use two compression program bits to select between the three levels as provided below:

| 00 | Cx (Maximum compression) |
| 01 | 0.5 Cx (50% compression) |
| 11 | 0.25 Cx (25% compression) |

The use of the compression program bits to control the multiplexer and the AND gate are disclosed in further detail in FIGS. 2 and 3 below. The ATE 120 also includes a compression program bit store 122 that stores one or more compression program bits.

The compressor 136 process the outputs from the scan chains to generate the scan_out signal 144. The ATE 120 evaluates the scan_out signal 144 to determine if the programmable scan controller 130 is operating as expected. If the scan_out signal 144 is not as expected, the ATE 120 may perform further diagnosis as necessary and send the results to the manufacturing so as to remedy the problem.

Figure 2:
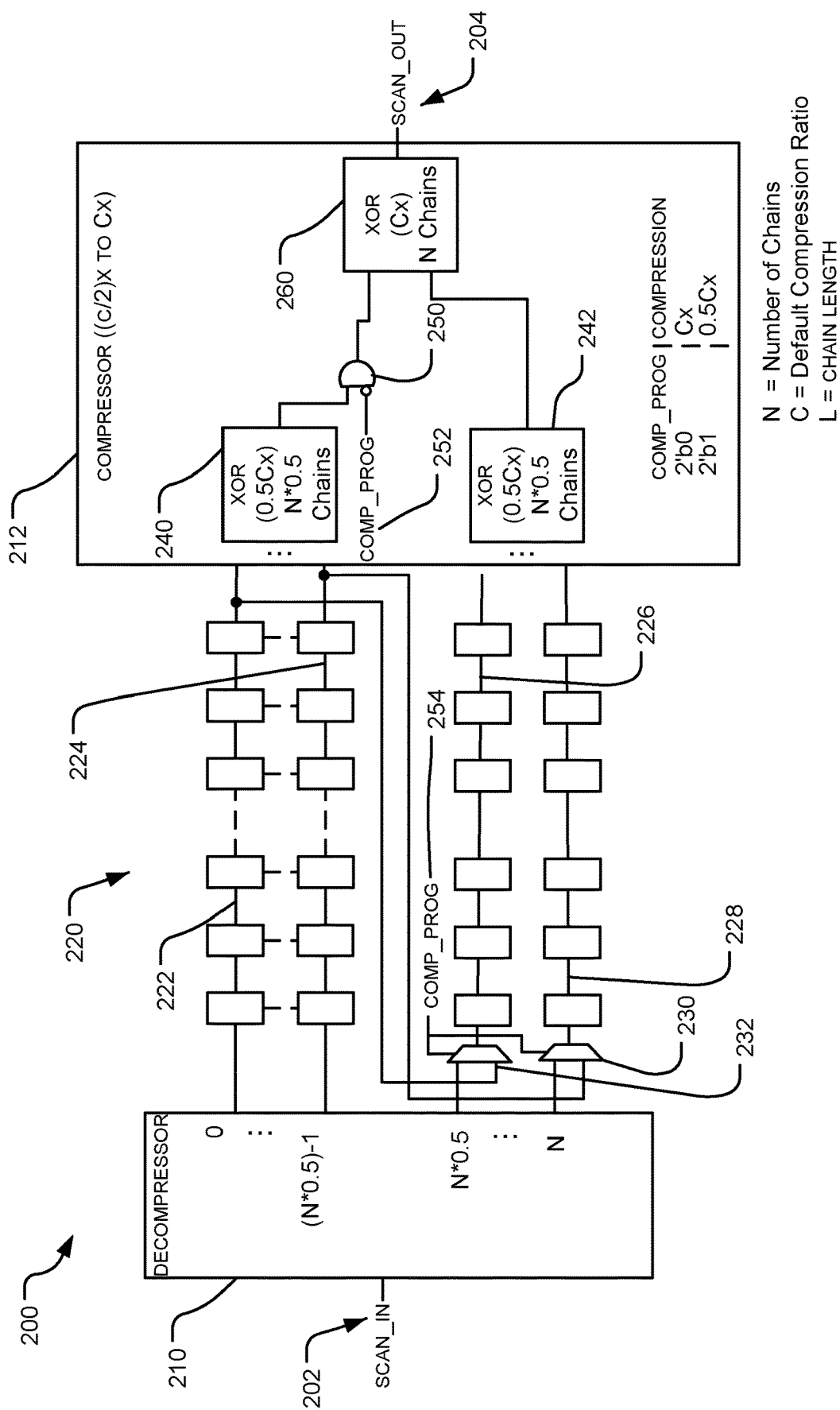
FIG. 2 illustrates an example block diagram of scan compression logic as disclosed herein.

FIG. 2 illustrates a block diagram 200 of scan compression logic as disclosed herein. In the illustrated implementation, a decompressor 210 receives a scan_in signal 202 and it decompresses it into a number of scan signals to be input to a chain structure 220. Specifically, the chain structure 220 is shown to have two scan partitions 222 to 224 and 226 to 228. The output from the scan structure 220 is input to a compressor 212 that generates a scan_out signal 204 that is returned back to an ATE (such as the ATE 120 of FIG. 1). Furthermore, the scan compression logic disclosed in FIG. 2 is configured to have 0.5 Cx compression in that for each of the scan chain partitions 222 to 224 and 226 to 228 there is one XOR logic in the compressor 212. Thus, there is an XOR logic 240 for the scan chain partition 222 to 224 and an XOR logic 242 for the scan chains partition 226 to 228.

The chain structure also includes multiplexers 230, 232 that can multiplex signals from two scan chains. For example, the multiplexer 232 multiplexes output from the scan chain 222 and the signal input to the scan chain 226. Similarly, the multiplexer 230 multiplexes output from the scan chain 224 and the signal input to the scan chain 228. The multiplexers 230, 232 are controlled by a compression program bit 254. In one implementation when the value of the compression program bit 254 is 0, and allows the signal on the scan chain partitions 222 to 224 and 226 to 228 to pass through. On the other hand, when the value of the compression program bit 254 is 1, it blocks signal on scan chain partitions 222 to 224 and allows the signal on the scan chain partitions 226 to 228 to pass through.

The compressor 212 includes a number of XOR logics 240, 242 where the output of the XOR logic 240 is input to an AND gate. The AND gate 250 also receives a compression program bit 252 as the other input thereto. The value of the compression program bit 252 is the same as the value of the compression program bit 254. When the value of the compression program bit 252 is 0, the AND gate 250 is transparent and it passes the output of the XOR logic 240 to an XOR logic 260. On the other hand, when the value of the compression program bit 252 is 1, the AND gate 250 blocks the output of the XOR logic 240 from being input to the XOR logic 260.

The scan compression system disclosed in FIG. 2 is programmable in that the compression ratio may be changed by a user by selecting the compression program bits 252, 254. In other words, the compression program bits 252, 254 are controllable. Specifically, when the compression program bits 252, 254 are programmed to be 0, there is maximum compression Cx. On the other hand, when the compression program bits 252, 254 is 1, the compression level is 0.5 Cx.

The selection of scan chains using the compression program bits 252, 254 allows controlling the lengths of the scan chains that that scan_in signal has to traverse. For example, when the multiplexers 230, 232 are enabled, the length of the scan chains that the scan_in signal 202 has to traverse is doubled as the scan_in signal 202 has to go through scan chains 222 and 226. Furthermore, reducing the number of scan_in signals 202 traversing through the scan chains also reduces the power used during the testing process.

Figure 3:
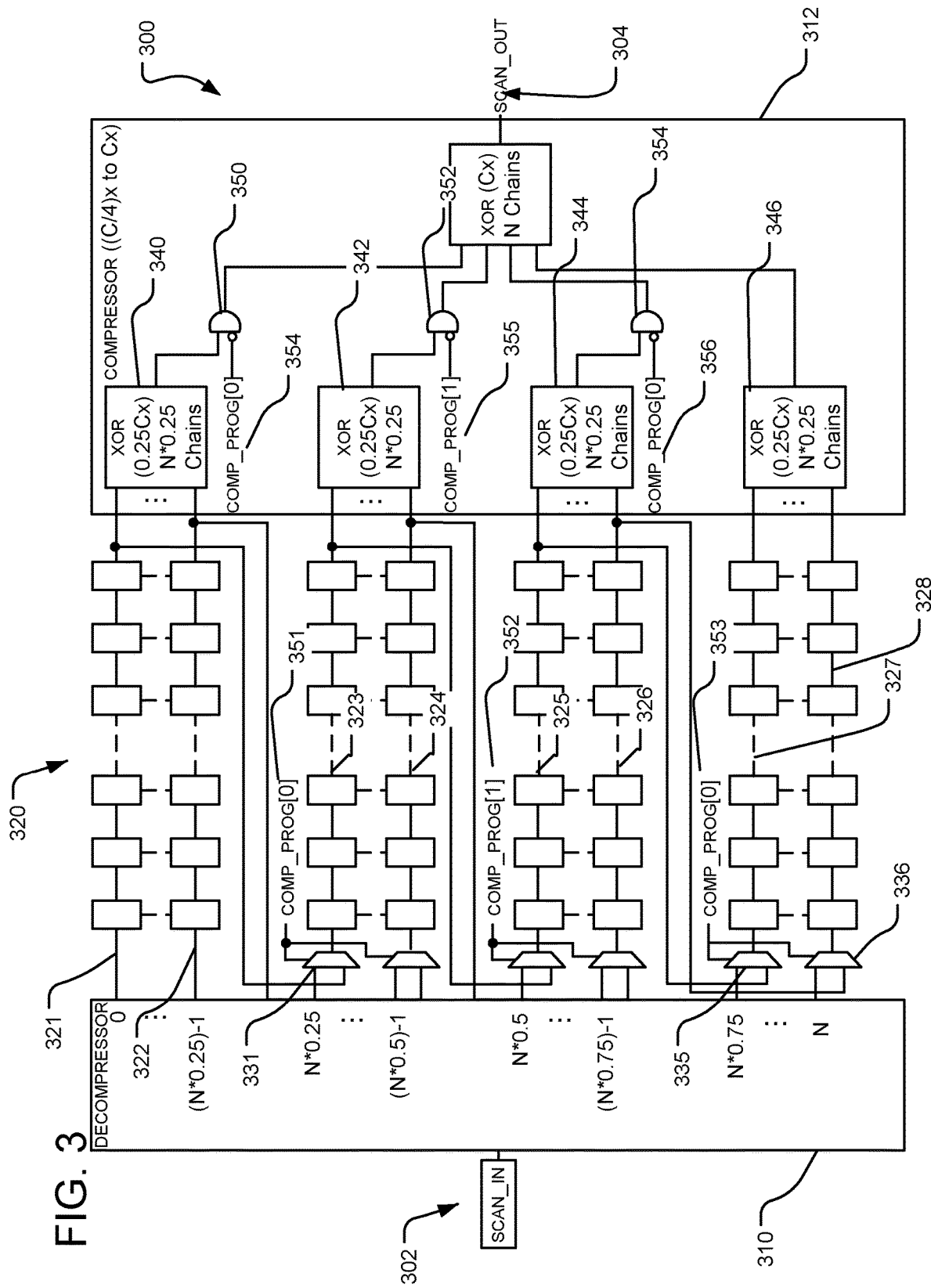

FIG. 3 illustrates an alternative block diagram 300 of scan compression logic as disclosed herein. In the illustrated implementation, a decompressor 310 receives a scan_in signal 302 and it decompresses it into a number of scan signals to be input to a chain structure 320. Specifically, the chain structure 320 is shown to have four scan chain partition 321-328. The output from the scan structure 320 is input to a compressor 312 that generates a scan_out signal 304 that is returned back to an ATE (such as the ATE 120 of FIG. 1). Furthermore, in the scan compression logic disclosed in FIG. 3 for each of the scan chain partition 321-328 there is one XOR logic in the compressor 312. Thus, there is an XOR logic 340 for the scan chain partitions 321-322, an XOR logic 342 for the scan chain partition 323-324, an XOR logic 344 for the scan chain partition 325-326, and an XOR logic 346 for the scan chain partition 327-328.

The chain structure also includes multiplexers 331-336 that can multiplex signals from two scan chains. For example, the multiplexer 331 multiplexes output from the scan chain 321 and the signal input to the scan chain 323. Similarly, the multiplexer 332 (Multiplexer name 323 is missing in FIG. 3) multiplexes output from the scan chain 322 and the signal input to the scan chain 324, etc. The multiplexers 331-336 are controlled by compression program bits 351-353. In one implementation when the value of the compression program bit 351-353 is 0, it allows the signal on the scan chain partition 321-328 to pass through. On the other hand, when the value of the compression program bit 351 and 353 is 1 along with 352 is 0, it blocks signal on scan chain partition 321-322 and 325-326 and allows the signal on the scan chain partitions 323-324 and 327-328 to pass through.

The compressor 312 includes a number of XOR logics 340, 342, 344, 346 where the output of the XOR logic 340 is input to an AND gate 350. The AND gate 350 also receives a compression program bit 354 as the other input thereto. The value of the compression program bit 354 is the same as the value of the compression program bit 351. When the value of the compression program bit 354 is 0, the AND gate 350 is transparent and it passes the output of the XOR logic 340 to an XOR logic 360. (XOR name 360 is missing in FIG. 6) On the other hand, when the value of the compression program bit 354 is 1, the AND gate 350 blocks the output of the XOR logic 340 from being input to the XOR logic 360.

The scan compression system disclosed in FIG. 3 is programmable in that the compression ratio may be changed by a user by selecting the compression program bits 351-356. In other words, the compression program bits 351-356 are controllable. Specifically, when the compression program bits are programmed to be 00, there is maximum compression Cx. On the other hand, when the compression program bits are programmed to be 01, the compression level is 0.5 Cx. Similarly, when the compression program bits are programmed to be 11, the compression level is 0.25 Cx.

While the implementation in FIG. 2 uses one compression program bit and the implementation in FIG. 3 uses two compression program bits, in alternative implementations, higher number of compression program bits may also be used. For example, using three compression program bits may allow compression of up to 0.125 Cx. The values of the compression program bits may be selected by the user and stored in a compression program bit store (such as the compression program bit store 122 disclosed in FIG. 1). The user has the capability to select the level of compression by selecting the value of the compression program bits. For example, the user may select the level of compression based on the complexity level of the IC and/or the power consumption considerations, etc. Furthermore, the user may also change the level of compression based on the test pattern on the scan_in signal (202, 302, etc.) input into the test structure. For example, the user may select the compression level so that it is inversely related to the amount of toggling in a test pattern of the scan_in signal.

FIG. 4 illustrates an example flowchart 400 including operations for the programmable scan compression as disclosed herein. An operation 402 receives a compression program bit. An operation 404 controls the scan chains of the test structure using the compression program bit. Similarly, an operation 406 controls an XOR logic of a compressor of the test structure. An operation 408 generates a scan_in signal for a test structure of an IC. An operation 410 communicates the scan_in signal to a decompressor of the test structure in the IC. An operation 412 generates a scan_out signal based on outputs of one or more of the XOR logics of the test structure.

In one implementation, the block diagrams and flowcharts disclosed above are implemented in hardware and/or in software (including firmware, resident software, microcode, etc.). Furthermore, various implementations may take the form of a computer program product on a computer-usable or computer-readable storage medium having computer-usable or computer-readable program code embodied in the medium for use by or in connection with an instruction execution system. Accordingly, as used herein, the term "circuit" may take the form of digital circuitry, such as processor circuitry (e.g., general-purpose microprocessor and/or digital signal processor) that executes program code, and/or analog circuitry.

The embodiments of the invention described herein are implemented as logical steps in one or more computer systems. The logical operations of the present invention are implemented (1) as a sequence of processor-implemented steps executing in one or more computer systems and (2) as interconnected machine or circuit modules within one or more computer systems. The implementation is a matter of choice, dependent on the performance requirements of the computer system implementing the invention. Accordingly, the logical operations making up the embodiments of the invention described herein are referred to variously as operations, steps, objects, or modules. Furthermore, it should be understood that logical operations may be performed in any order, unless explicitly claimed otherwise or a specific order is inherently necessitated by the claim language.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. An apparatus, comprising:
    a decompressor logic with the capability to decompress a scanning input signal to generate a decompressed signal;
    a plurality of multiplexers to multiplex the decompressed signal based on values of compression program bits onto a plurality of scan chains such that length of the plurality of scan chains traversed by the decompressed signal is determined by the values of the compression program bits; and
    a compressor logic configured to receive output from the plurality of scan chains and to generate a scanning output signal, the compressor logic including a plurality of XOR logics, wherein the output of the plurality of XOR logics is selected based on the values of the compression program bits.

2. The apparatus of claim 1, wherein the decompressed signal is input to the plurality of scan chains and the signal output from the plurality of scan chains is input to the compressor logic.

3. The apparatus of claim 2, wherein the plurality of multiplexers controlling the input to the plurality of scan chains, wherein one of the compression program bits is input as a control bit for the one or more of the plurality of multiplexers.

4. The apparatus of claim 3, wherein the compressor logic further comprising one or more AND gates and an input to the one or more AND gates is an output signal from the XOR logics.

5. The apparatus of claim 4, wherein another input to the one or more AND gates is the one of the compression program bits.

6. The apparatus of claim 1, wherein compression program bits include two-bits that allows the level of compression of the scanning input signal at three different levels.

7. The apparatus of claim 1, wherein scan compression program bits include one-bit that allows the level of compression of the scanning signal at two different levels of Cx and 0.5Cx, wherein Cx being maximum compression.

8. A programmable scan controller, comprising:
a decompressor logic, configured to decompress a scanning input signal to generate a decompressed signal;
a plurality of multiplexers to multiplex the decompressed signal based on values of compression program bits onto a plurality of scan chains such that length of the plurality of scan chains traversed by the decompressed signal is determined by the values of the compression program bits; and
a compressor logic configured to receive output from the plurality of scan chains and to generate a scanning output signal, the compressor logic including a plurality of XOR logics, wherein the output of the plurality of XOR logics is selected based on the values of the compression program bits.

9. The programmable scan controller of claim 8, wherein the decompressed signal is input to the plurality of scan chains and the signal output from the plurality scan chains is input to the compressor logic.

10. The programmable scan controller of claim 8, wherein the compressor logic further comprising one or more AND gates and an input to the one or more AND gates is an output signal from the XOR logics.

11. The programmable scan controller of claim 8, wherein another input to the one or more AND gates is the one of the compression program bits.

12. The programmable scan controller of claim 8, wherein the compression program bits include two-bits with values that allows the level of compression of the scanning input signal at three different levels.

13. The programmable scan controller of claim 8, wherein the compression program bits include one-bit with value that allows the level of compression of the scanning signal at two different levels of Cx and 0.5Cx, wherein Cx being maximum compression.

14. A test structure of an integrated circuit (IC), comprising:
a decompressor logic with the capability to decompress a scanning input signal to generate a decompressed signal;
a plurality of multiplexers to multiplex the decompressed signal based on values of compression program bits onto a plurality of scan chains such that length of the plurality of scan chains traversed by the decompressed signal is determined by the values of the compression program bits; and
a compressor logic to configured to receive output from the plurality of scan chains and generate a scanning output signal, the compressor logic including a plurality of XOR logics, wherein the output of the plurality of XOR logics is selected based on the values of the compression program bits.

15. The test structure of claim 14 wherein the decompressed signal is input to the plurality of scan chains and the signal output from the plurality scan chains is input to the compressor logic.

16. The test structure of claim 14, wherein compression program bits include two-bits that allows the level of compression of the decompressed signal at three different levels.

17. The test structure of claim 14, wherein scan compression program bits include one-bit that allows the level of compression of the scanning signal at two different levels of Cx and 0.5Cx, wherein Cx being maximum compression.

* * * * *